United States Patent
Zhang et al.

(10) Patent No.: US 12,125,931 B2
(45) Date of Patent: Oct. 22, 2024

(54) TANDEM SOLAR CELL

(71) Applicant: BEIJING ZENITHNANO TECHNOLOGY CO., LTD., Beijing (CN)

(72) Inventors: Yuchun Zhang, Beijing (CN); Shudong Zhong, Beijing (CN)

(73) Assignee: BEIJING ZENITHNANO TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 18/689,434

(22) PCT Filed: Oct. 12, 2021

(86) PCT No.: PCT/CN2021/123383
§ 371 (c)(1),
(2) Date: Mar. 6, 2024

(87) PCT Pub. No.: WO2023/039967
PCT Pub. Date: Mar. 23, 2023

(65) Prior Publication Data
US 2024/0266452 A1 Aug. 8, 2024

(30) Foreign Application Priority Data
Sep. 16, 2021 (CN) .......... 202111096360.2

(51) Int. Cl.
*H01L 31/0725* (2012.01)
*H01L 31/0216* (2014.01)
(Continued)

(52) U.S. Cl.
CPC .... *H01L 31/0725* (2013.01); *H01L 31/02168* (2013.01); *H01L 31/022466* (2013.01);
(Continued)

(58) Field of Classification Search
CPC ..... H01L 31/022466; H01L 31/022491; H01L 31/02167; H01L 31/02168; H01L 31/0725; H01L 31/02327; H01L 31/056
See application file for complete search history.

(56) References Cited

U.S. PATENT DOCUMENTS

2009/0084438 A1* 4/2009 den Boer ........ H01L 31/022466
136/256
2009/0223566 A1 9/2009 Mitsui et al.

FOREIGN PATENT DOCUMENTS

| CN | 106575676 A | 4/2017 |
| CN | 108123046 A | 6/2018 |

(Continued)

OTHER PUBLICATIONS

English machine translation of CN 111430384A. (Year: 2020).*

(Continued)

*Primary Examiner* — Lindsey A Buck
(74) *Attorney, Agent, or Firm* — Bayramoglu Law Offices LLC

(57) ABSTRACT

A tandem solar cell is provided. The tandem solar cell includes: a light absorbing layer group, including an excitation layer, a first electron transport layer group provided on a first side of the excitation layer and a first hole transport layer group provided on a second side of the excitation layer; a heterojunction layer group, where the heterojunction layer group includes a first side being a second electron transport layer in contact with the first hole transport layer group, and a second side being a second hole transport layer; a reflection layer is provided on a side of the second hole transport layer; and the reflection layer reflects sunlight irradiated thereon through the light absorbing layer group and the heterojunction layer group into the tandem solar cell.

11 Claims, 2 Drawing Sheets

(51) Int. Cl.
*H01L 31/0224* (2006.01)
*H01L 31/0232* (2014.01)
*H01L 31/028* (2006.01)
*H01L 31/043* (2014.01)
*H01L 31/056* (2014.01)

(52) U.S. Cl.
CPC ...... *H01L 31/02327* (2013.01); *H01L 31/028* (2013.01); *H01L 31/043* (2014.12); *H01L 31/056* (2014.12)

(56) References Cited

FOREIGN PATENT DOCUMENTS

| | | | | | |
|---|---|---|---|---|---|
| CN | 208548372 | U | | 2/2019 | |
| CN | 109935690 | A | | 6/2019 | |
| CN | 209016100 | U | | 6/2019 | |
| CN | 111384187 | A | | 7/2020 | |
| CN | 111430384 | A | * | 7/2020 | |
| CN | 111640867 | A | | 9/2020 | |
| EP | 2546887 | A1 | * | 1/2013 | ....... H01L 31/03529 |
| EP | 3712967 | A1 | | 9/2020 | |

OTHER PUBLICATIONS

D. T. Pierce, et al., Electronic Structure of Amorphous Si from Photoemission and Optical Studies, Physical Review B, 1972, pp. 3017-3029, vol. 5 No. 8.

* cited by examiner

TANDEM SOLAR CELL

CROSS-REFERENCE TO THE RELATED APPLICATIONS

This application is the national phase entry of International Application No. PCT/CN2021/123383, filed on Oct. 12, 2021, which is based upon and claims priority to Chinese Patent Application No. 202111096360.2, filed on Sep. 16, 2021, the entire contents of which are incorporated herein by reference.

TECHNICAL FIELD

The present disclosure relates to the field of photovoltaics, and in particular to a tandem solar cell.

BACKGROUND

A solar cell is a thin optoelectronic semiconductor piece that generates electricity directly from sunlight. The basic principles of solar cells are that: sunlight strikes the p-n junction of the semiconductor to generate hole-electron pairs. Under the action of the built-in electric field of the p-n junction, the photo-generated holes flow to the p region, the photo-generated electrons flow to the n region, and a current is generated after the circuit is turned on. However, currently, the conversion efficiency of solar cells is low and needs to be improved.

SUMMARY

To solve the above problem, the present disclosure proposes a tandem solar cell. The tandem solar cell includes: a light absorbing layer group, including an excitation layer, a first electron transport layer group provided on a first side of the excitation layer and a first hole transport layer group provided on a second side of the excitation layer; and a heterojunction layer group, where the heterojunction layer group includes a first side being a second electron transport layer in contact with the first hole transport layer group, and a second side being a second hole transport layer; a reflection layer is provided on a side close to the second hole transport layer of the heterojunction layer group; the reflection layer reflects sunlight irradiated thereon through the light absorbing layer group and the heterojunction layer group into the tandem solar cell; under the irradiation of the sunlight and reflected light, the excitation layer and the heterojunction layer group are excited; electrons generated by the excitation layer are transported out of the tandem solar cell through the first electron transport layer; holes generated by the excitation layer flow to the heterojunction layer group through the first hole transport layer group and combine with electrons generated by the heterojunction layer group; and holes generated by the heterojunction layer group are transported out of the tandem solar cell from the second hole transport layer.

In an embodiment, the first hole transport layer group may include a hole transport layer in contact with the excitation layer and a PN junction in contact with the hole transport layer; and the PN junction may be in contact with the second electron transport layer.

In an embodiment, a light transmission layer may be provided between the second hole transport layer and the reflection layer; and the light transmission layer may have a refractive index less than a refractive index of the second hole transport layer.

In an embodiment, the light transmission layer may have a refractive index of 1.15-1.35 and a thickness of 50-200 nm; and the second hole transport layer may have a refractive index of 3.5-4.2 and a thickness of 0-30 nm.

In an embodiment, the light transmission layer may include: a first conductive layer in contact with the second hole transport layer, a first protective layer in contact with the first conductive layer, a second conductive layer in contact with the first protective layer, a second protective layer in contact with the second conductive layer, and a light exit layer in contact with the second protective layer; the first conductive layer may have a first refractive index $n1$ and a first thickness $d1$, the first protective layer may have a second refractive index $n2$ and a second thickness $d2$, the second conductive layer may have a third refractive index $n3$ and a third thickness $d3$, the second protective layer may have a fourth refractive index $n4$ and a fourth thickness $d4$, and the light exit layer may have a fifth refractive index $n5$ and a fifth thickness $d5$, where $n1$ may be 1.8-2.1, and $d1$ may be 20-80 nm; $n2$ may be 0.1-5, and $d2$ may be 0.5-10 nm; $n3$ may be 0.1-1.5, and $d3$ may be 5-50 nm; $n4$ may be 1.3-2.1, and $d4$ may be 0.5-25 nm; and $n5$ may be 1.4-2.4, and $d5$ may be 20-80 nm.

In an embodiment, the first conductive layer may include a conductive metal oxide; the first protective layer may include one of a metal, a conductive metal oxide and a conductive metal nitride; the second conductive layer may include a conductive material and a metal oxide and/or a metal nitride; the second protective layer may include one of a non-metal oxide, a metal nitride and a metal oxide; and the light exit layer may include one of a non-metal oxide, a nitride, a sulfide, a fluoride and a carbide.

In an embodiment, the first conductive layer may be made of one of $In_2O_3$, $SnO_2$, ZnO, ITO, AZO, IZO, ITiO, IZTO and FTO; the first protective layer may be made of one of Si, Ti, Al, Ni, Cr, NiCr, TiN, ZnO, $TiO_2$, $SnO_2$, $SiO_2$, $Nb_2O_5$, $Ta_2O_5$ and $Si_3N_4$; the conductive material of the second conductive layer may be one of Ag, Cu, Al, Mo, an Ag alloy, a Cu alloy, an Al alloy and a Mo alloy, and the second conductive layer further may include an inclusion formed from an oxide and/or a nitride of the conductive material of the second conductive layer; the second protective layer may be made of one of TiN, ZnO, $TiO_2$, $SnO_2$, $SiO_2$, $Si_3N_4$, AZO, IZO and YZO; and the light exit layer may be made of one of $TiO_2$, $SnO_2$, ZnO, $Nb_2O_5$, $Ta_2O_5$, $Si_3N_4$, ZnS, $SiO_2$, $Al_2O_3$, MgF, MgS, SiC, AZO, GZO and YZO.

In an embodiment, the heterojunction layer group may include: an N-type Si wafer; a first intrinsic amorphous silicon layer on a first surface of the N-type Si wafer, where the first intrinsic amorphous silicon layer may be doped with oxygen; an N-type amorphous silicon layer on the first intrinsic amorphous silicon layer, where the N-type amorphous silicon layer may form the second electron transport layer; a second intrinsic amorphous silicon layer on a second surface of the N-type Si wafer, where the second intrinsic amorphous silicon layer may be the same as the first intrinsic amorphous silicon layer; and a P-type amorphous silicon layer on the second intrinsic amorphous silicon layer, where the P-type amorphous silicon layer may form the second hole transport layer.

In an embodiment, the first intrinsic amorphous silicon layer may include 0-30 wt % of oxygen.

In an embodiment, the PN junction may include an N-type nano-silicon layer in contact with the second electron transport layer and a P-type nano-silicon layer on the N-type nano-silicon layer; and the P-type nano-silicon layer may be in contact with the hole transport layer.

In an embodiment, the first electron transport layer group may include an electron transport layer in contact with the excitation layer and a conductive layer in contact with the electron transport layer.

In an embodiment, the conductive layer may be made of $In_2O_3$ and a dopant, which may be one or more of $Ga_2O_3$, $ZnO_2$, $CeO_2$, $TiO_2$, $Mo_2O_3$, $ZrO_2$ and $WO_2$, where the conductive layer may include 80-100 wt % of $In_2O_3$, and the balance being the dopant and an inevitable impurity; or the conductive layer may be made of ZnO and a dopant, which may be one or more of $SnO_2$, $Al_2O_3$, $Ga_2O_3$ and $B_2O_3$, where the conductive layer may include 80-100 wt % of ZnO, and the balance being the dopant and an inevitable impurity.

In an embodiment, the reflection layer may be made of one of Ag, Al, Cu and Mo.

Compared with the prior art, the present disclosure has the following beneficial effects. In the tandem solar cell of the present disclosure, the heterojunction layer group increases the number of hole-electron pairs generated by the excitation of the light absorbing layer group, thereby greatly improving the efficiency of the tandem solar cell.

BRIEF DESCRIPTION OF THE DRAWINGS

The drawings described here are provided for further understanding of the present disclosure, and constitute a part of the present disclosure. The exemplary embodiments of the present disclosure and illustrations thereof are intended to explain the present disclosure, but do not constitute inappropriate limitations to the present disclosure. Drawings.

DETAILED DESCRIPTION OF THE EMBODIMENTS

To make the objective, technical solutions and advantages of the present disclosure clearer, the technical solutions in the present disclosure are clearly and completely described below with reference to specific embodiments and corresponding drawings of the present disclosure.

Apparently, the described embodiments are some rather than all of the embodiments of the present disclosure. All other embodiments obtained by those of ordinary skill in the art based on the embodiments of this application without creative efforts should fall within the protection scope of this application.

Figure 1:
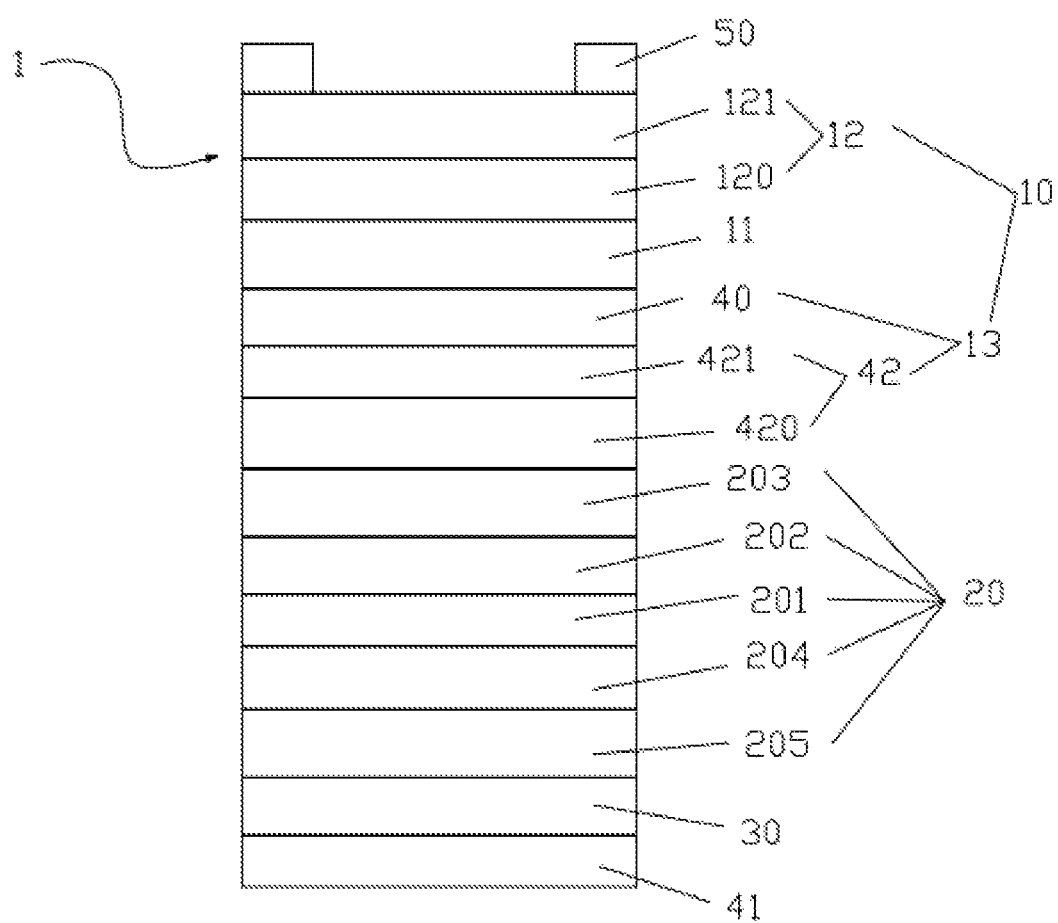
FIG. 1 is schematic diagram of a tandem solar cell according to an embodiment of the present disclosure.

FIG. 1 is schematic diagram of a tandem solar cell 1 according to an embodiment of the present disclosure. As shown in FIG. 1, the tandem solar cell 1 includes a light absorbing layer group 10 and a heterojunction layer group 20 inside (i.e. in a direction away from the external environment) and in contact with the light absorbing layer group 10. The light absorbing layer group 10 includes an excitation layer 11, a first electron transport layer group 12 provided on a first side of the excitation layer 11 and a first hole transport layer group 13 provided on a second side of the excitation layer 11. A first side of the heterojunction layer group 20 is a second electron transport layer 203 and is in contact with the first hole transport layer group 13. A second side of the heterojunction layer group 20 is a second hole transport layer 205. A reflection layer 41 is provided on a side close to the second hole transport layer 205 of the heterojunction layer group 20. The reflection layer 41 reflects sunlight irradiated thereon through the light absorbing layer group 10 and the heterojunction layer group 20 into the tandem solar cell 1.

In the tandem solar cell 1, under the irradiation of the sunlight and reflected light, the excitation layer 11 and the heterojunction layer group 20 are excited. Electrons generated by the excitation layer 11 are transported out of the tandem solar cell 1 through the first electron transport layer 12. Holes generated by the excitation layer 11 flow to the heterojunction layer group 20 through the first hole transport layer group 13 and combine with electrons generated by the heterojunction layer group 20. Holes generated by the heterojunction layer group 20 are transported out of the tandem solar cell 1 from the second hole transport layer 205. In this way, the heterojunction layer group 20 increases the number of hole-electron pairs generated by the excitation of the light absorbing layer group 10, thereby greatly improving the efficiency of the tandem solar cell 1. In particular, the reflection layer 41 can reflect sunlight incident into the tandem solar cell 1 to further excite the heterojunction layer group 20, and even the light absorbing layer group 10. This maximizes the utilization of the incident light, thereby greatly improving the efficiency of the tandem solar cell 1.

In an embodiment, reflection layer 41 is made of one of Ag, Al, Cu and Mo. These materials can be made into a very thin and highly reflective layer, which can improve the efficiency of the tandem solar cell 1.

In an embodiment, the first hole transport layer group 13 includes a hole transport layer 40 in contact with excitation layer 11 and a PN junction 42 in contact with the hole transport layer 40. The PN junction 42 is also excited under sunlight, thereby further increasing the number of hole-electron pairs generated by the excitation of the light absorbing layer group 10, and further improving the efficiency of the tandem solar cell 1.

In an embodiment, a light transmission layer 30 is provided between the second hole transport layer 205 and the reflection layer 41; and the light transmission layer 30 has a refractive index less than a refractive index of the second hole transport layer 205. Since the refractive index of the light transmission layer 30 is less than the refractive index of the second hole transport layer 205, the anti-reflection layer is formed. The anti-reflection layer facilitates sunlight entering the interior of the tandem solar cell 1 (i.e. more sunlight irradiates the heterojunction layer group 20), and facilitates the excitation of the heterojunction layer group 20, improving the efficiency of the tandem solar cell 1.

In an embodiment, the light transmission layer 30 has a refractive index of 1.15-1.35 and a thickness of 50-200 nm; and the second hole transport layer 205 has a refractive index of 3.5-4.2 and a thickness of 0-30 nm. It should be understood that, in the present disclosure, the thickness of the second hole transport layer 205 is not equal to zero, but may be greater than zero. This parameter of the light transmission layer 30 and the second hole transport layer 205 is set within this range. In this way, sunlight is effectively irradiated to the reflection layer 41, and the reflection layer 41 well reflects the light into the tandem solar cell 1, thereby improving the efficiency of the tandem solar cell 1.

Figure 2:
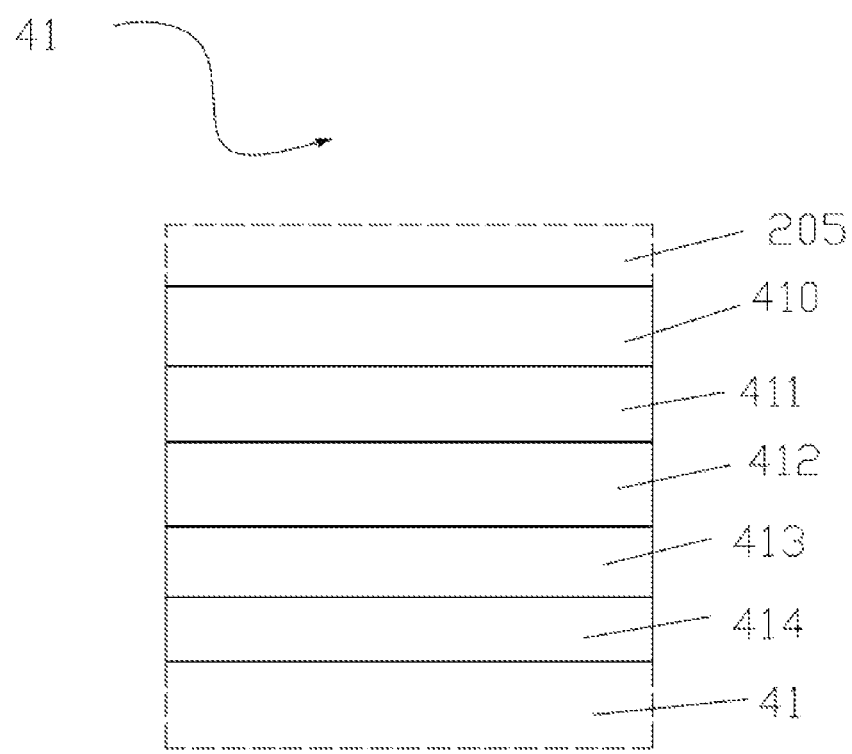
FIG. 2 is a schematic diagram of a light transmission layer shown in FIG. 1.

As shown in FIG. 2, the light transmission layer 30 includes: a first conductive layer 410 in contact with the second hole transport layer 205, a first protective layer 411 in contact with the first conductive layer 410, a second conductive layer 412 in contact with the first protective layer 411, a second protective layer 413 in contact with the second conductive layer 412, and a light exit layer 414 in contact with the second protective layer 413. That is, the first conductive layer 410, the first protective layer 411, the second conductive layer 412, the second protective layer 413 and the light exit layer 414 are tandem. In addition, the first conductive layer 410 is in electrical contact with the PN junction 42, and the light exit layer 414 is in contact with the heterojunction layer group 20.

The first conductive layer 410 has a first refractive index n1 and a first thickness d1, the first protective layer 411 has a second refractive index n2 and a second thickness d2, the second conductive layer 412 has a third refractive index n3 and a third thickness d3, the second protective layer 413 has a fourth refractive index n4 and a fourth thickness d4, and the light exit layer 414 has a fifth refractive index n5 and a fifth thickness d5. n1 is 1.8-2.1, and d1 is 20-80 nm; n2 is 0.1-5, and d2 is 0.5-10 nm; n3 is 0.1-1.5, and d3 is 5-50 nm; n4 is 1.3-2.1, and d4 is 0.5-25 nm; and n5 is 1.4-2.4, and d5 is 20-80 nm. By configuring the light transmission layer 30 as these sub-layers, it is convenient to adjust the refractive index of the light transmission layer 30 to 1.15-1.35, while maintaining the thickness of the light transmission layer 30 to be 50-200 nm. In this way, sunlight and reflected light can effectively enter into the tandem solar cell 1, so as to improve the efficiency of the tandem solar cell 1.

It should be understood that the number of sub-layers of the light transmission layer 30 may be more or less (even, it may be one sub-layer), as long as the thickness and refractive index of the sub-layers can meet the requirements, which will not be repeated here.

The first conductive layer 410 includes a conductive metal oxide. For example, the first conductive layer 410 is made of one of $In_2O_3$, $SnO_2$, ZnO, ITO, AZO, IZO, ITiO, IZTO and FTO. The ITO is doped with $SnO_2$, which is greater than 0 and less than or equal to 50 wt %. The IZO is doped with ZnO, which is greater than 0 and less than or equal to 50 wt %. The AZO is doped with $Al_2O_3$, which is greater than 0 and less than or equal to 50 wt %. The ITiO is doped with $TiO_2$, which is greater than 0 and less than or equal to 10 wt %. The ITiZO is doped with $TiO_2$, which is greater than 0 and less than or equal to 10 wt %, and ZnO, which is greater than 0 and less than or equal to 40 wt %. The FTO is doped with F, which is greater than 0 and less than or equal to 10 wt %. When the above materials are used, the required refractive index can be achieved, and the efficiency of the tandem solar cell 1 can be improved.

The first protective layer 411 includes one of a metal, a conductive metal oxide and a conductive metal nitride. For example, the metal may be one or a group consisting of Si, Ti, Al, Ni, Cr and NiCr. The metal oxide may be one or a group consisting of ZnO, $TiO_2$, $SnO_2$, $SiO_2$, $Nb_2O_5$ and $Ta_2O_5$. The metal nitride may be one or a group consisting of TiN and $Si_3N_4$. By selecting these materials, the first protective layer 411 can achieve the required refractive index and desired anti-oxidation performance. This can prevent oxygen molecules from penetrating into the second conductive layer 412, thereby ensuring that the second conductive layer 412 has desired conductivity.

The second conductive layer 412 includes a conductive material and an inevitable inclusion of a metal oxide and/or a metal nitride. For example, the conductive material is one of Ag, Cu, Al, Mo, an Ag alloy, a Cu alloy, an Al alloy and a Mo alloy. In a specific embodiment, the Ag alloy includes greater than 50 wt % of Ag, and the balance (50%) being one of Zn, Cu, In, Pt, Pd, Au, Nb, Nd, B, Bi and Ni. The Cu alloy includes greater than 50 wt % of Cu, and the balance (50%) being one of Zn, Ag, In, Pt, Pd, Au, Nb, Nd, B, Bi and Ni. The Mo alloy layer includes greater than 80 wt % of Mo, and the balance (20%) being one of Zn, Cu, In, Pt, Pd, Au, Nb, Nd, B, Bi and Ni. The Al alloy layer includes greater than 80 wt % of Al, and the balance (20%) being one of Zn, Cu, In, Pt, Pd, Au, Nb, Nd, B, Bi and Ni. The metal oxide and/or metal nitride inclusion is formed by oxidizing and nitriding the metal or alloy by a small amount of oxygen and nitrogen introduced during the coating process of the metal target. The metal oxide and metal nitride also improve the light transmittance of the second conductive layer 412. This design increases the efficiency of the tandem solar cell 1.

The second protective layer 413 includes one of a non-metal oxide, a metal nitride and a metal oxide. For example, the non-metal oxide, the metal nitride and the metal oxide may be TiN, ZnO, $TiO_2$, $SnO_2$, $SiO_2$ and $Si_3N_4$. The second protective layer 413 formed by these compounds has desired weather resistance and water resistance, and improves the protection effect on the second conductive layer 412.

The light exit layer 414 includes one of a non-metal oxide, a nitride, a sulfide, a fluoride and a carbide. For example, the light exit layer 414 is made of one of $TiO_2$, $SnO_2$, ZnO, $Nb_2O_5$, $Ta_2O_5$, $Si_3N_4$, ZnS, $SiO_2$, $Al_2O_3$, MgF, MgS, SiC, AZO, GZO and YZO. These materials have high refractive indices and meet the refractive index requirements of the light exit layer 414.

Further, as shown in FIG. 1, the PN junction 42 includes an N-type nano-silicon layer 420 in contact with the second electron transport layer 203 and a P-type nano-silicon layer 421 on the N-type nano-silicon layer 420. The P-type nano-silicon layer 421 is in contact with the hole transport layer 40. The PN junction 42 can improve the excitation effect on the excitation layer 11, and effectively reduce the interface resistance, thereby improving the efficiency of the tandem solar cell 1.

Further, as shown in FIG. 1, the heterojunction layer group 20 includes: an N-type Si wafer 201; a first intrinsic amorphous silicon layer 202 on a first surface of the N-type Si wafer 201, where the first intrinsic amorphous silicon layer 202 is doped with oxygen; an N-type amorphous silicon layer 203 on the first intrinsic amorphous silicon layer 202, where the N-type amorphous silicon layer 203 forms the second electron transport layer 203; a second intrinsic amorphous silicon layer 204 on a second surface of the N-type Si wafer 201, where the second intrinsic amorphous silicon layer 204 is the same as the first intrinsic amorphous silicon layer 201; and a P-type amorphous silicon layer 205 on the second intrinsic amorphous silicon layer 204, where the P-type amorphous silicon layer 205 forms the second hole transport layer 205. In the heterojunction layer group 20, the semiconductor layer groups on the two sides of the N-type Si wafer 201 can both be excited, thereby improving the photo-excitation efficiency of the heterojunction layer group 20. This design can further improve the photo-excitation effect of the light absorbing layer group 10, thereby further improving the efficiency of the tandem solar cell 1. In addition, oxygen is doped in the first intrinsic amorphous silicon layer 202 and the second intrinsic amorphous silicon layer 204. This can increase the light transmittance of the first intrinsic amorphous silicon layer 202 and the second intrinsic amorphous silicon layer 204, thereby further improving the excitation effect of the heterojunction layer group 20 and further improving the efficiency of the tandem solar cell 1.

In a specific embodiment, the first intrinsic amorphous silicon layer 202 includes 0-30 wt % of oxygen. It should be noted that, the content of the oxygen in the first intrinsic amorphous silicon layer 202 is greater than 0. The concentration of the doped oxygen improves the light transmittance of the first intrinsic amorphous silicon layer 202 and the second intrinsic amorphous silicon layer 204. In addition, Si will not be fully synthesized into SiO2, and the first intrinsic amorphous silicon layer 202 and the second intrinsic amorphous silicon layer 204 still have a high electron/hole transport effect, which further improves the efficiency of the tandem solar cell 1.

The first electron transport layer group 12 includes an electron transport layer 120 in contact with excitation layer 11 and a conductive layer 121 in contact with the electron transport layer 120. In a specific embodiment, the conductive layer 121 is made of $In_2O_3$ and a dopant, which is one or more of $Ga_2O_3$, $ZnO_2$, $CeO_2$, $TiO_2$, $Mo_2O_3$, $ZrO_2$ and $WO_2$, where the conductive layer includes 80-100 wt % of $In_2O_3$, and the balance being the dopant and an inevitable impurity. Alternatively, the conductive layer 121 is made of ZnO and a dopant, which is one or more of $SnO_2$, $Al_2O_3$, $Ga_2O_3$ and $B_2O_3$, where the conductive layer includes 80-100 wt % of ZnO, and the balance being the dopant and an inevitable impurity. Compared with ITO used in the prior art, the material of the conductive layer 121 of the present disclosure achieves better light transmittance and conductivity, thereby further improving the efficiency of the tandem solar cell 1.

It should also be understood that a metal electrode layer 50 is provided on an outer side of the conductive layer 121. The electrode layer 50 is configured to communicate with an external wire for conducting electricity, which will not be repeated here.

Embodiment 1

In the light absorbing layer 10, the excitation layer 11 is made of photoactive perovskite $MAPbI_3$. The electron transport layer 120 is made of ZnO and has a thickness of 20 nm. The conductive layer 121 is made of ITZO, where $In_2O_3$ is doped with $TiO_2$ and ZnO, and the conductive layer includes 89 wt % of $In_2O_3$, 10 wt % of ZnO, and the balance being $TiO_2$ and an inevitable impurity. The hole transport layer 40 is made of NiO.

In the PN junction 42, the P-type nano-silicon layer 421 has a thickness of 28 nm, and the N-type nano-silicon layer 420 has a thickness of 29 nm.

In the light transmission layer 30, the first conductive layer 410 is made of ITO, and has a thickness of 47 nm and a refractive index of 2.0. The first protective layer 411 is made of Ti, and has a thickness of 0.5 nm and a refractive index of 1.9. The second conductive layer 412 is made of a mixture of AgPd and $AgPdO_x$, and has a thickness of 8 nm and a refractive index of 0.3. The second protective layer 413 is made of ZnO, and has a thickness of 5 nm and a refractive index of 2.0. The light exit layer 414 is made of $TiO_2$, and has a thickness of 40 nm and a refractive index of 1.9.

In the heterojunction layer group 20, the N-type Si wafer 201 has a thickness of 0.2 mm. The first intrinsic amorphous silicon layer 202 and the second intrinsic amorphous silicon layer 204 include 25 wt % of oxygen and have a thickness of 10 nm. The N-type amorphous silicon layer 203 has a thickness of 20 nm, and the P-type amorphous silicon layer 205 has a thickness of 20 nm.

The reflection layer 41 is made of Al and has a thickness of 150 nm.

The metal electrode layer 50 is made of an Ag paste.

The efficiency of the tandem solar cell of Embodiment 1 is shown in Table 1.

Embodiment 2

In the light absorbing layer 10, the excitation layer 11 is made of photoactive perovskite $MAPbI_3$. The electron transport layer 120 is made of SnO and has a thickness of 15 nm. The conductive layer 121 is made of ICO, where $In_2O_3$ is doped with $CeO_2$, and the conductive layer includes 97.5 wt % of $In_2O_3$. The hole transport layer 40 is made of $MoO_3$.

In the PN junction 42, the P-type nano-silicon layer 421 has a thickness of 20 nm, and the N-type nano-silicon layer 420 has a thickness of 30 nm.

In the light transmission layer 30, the first conductive layer 410 is made of AZO, and has a thickness of 50 nm and a refractive index of 2.0. The first protective layer 411 is made of Si, and has a thickness of 1 nm and a refractive index of 3.8. The second conductive layer 412 is made of a mixture of AlTi and $AlTiO_x$, and has a thickness of 15 nm and a refractive index of 1.0. The second protective layer 413 is made of $SnO_2$, and has a thickness of 10 nm and a refractive index of 2.0. The light exit layer 414 is made of ZnO, and has a thickness of 35 nm and a refractive index of 2.0.

In the heterojunction layer group 20, the N-type Si wafer 201 has a thickness of 0.2 mm. The first intrinsic amorphous silicon layer 202 and the second intrinsic amorphous silicon layer 204 include 20 wt % of oxygen and have a thickness of 7 nm. The N-type amorphous silicon layer 203 has a thickness of 20 nm, and the P-type amorphous silicon layer 205 has a thickness of 20 nm.

The reflection layer 41 is made of Cu and has a thickness of 20 nm.

The metal electrode layer 50 is made of an Ag paste.

The efficiency of the tandem solar cell of Embodiment 2 is shown in Table 1.

Embodiment 3

In the light absorbing layer 10, the excitation layer 11 is made of photoactive perovskite $MAPbI_3$. The electron transport layer 120 is made of $SnO_2$ and has a thickness of 15 nm. The conductive layer 121 is made of IWO, where $In_2O_3$ is doped with $CeO_2$, and the conductive layer includes 97.5 wt % of $In_2O_3$. The hole transport layer 40 is made of $WO_3$.

In the PN junction 42, the P-type nano-silicon layer 421 has a thickness of 25 nm, and the N-type nano-silicon layer 420 has a thickness of 15 nm.

In the light transmission layer 30, the first conductive layer 410 is made of FTO, and has a thickness of 60 nm and a refractive index of 1.9. The first protective layer 411 is made of NiCr, and has a thickness of 1 nm and a refractive index of 1.8. The second conductive layer 412 is made of a mixture of AgZn and $AgZnO_x$, and has a thickness of 9 nm and a refractive index of 0.3. The second protective layer 413 is made of $TiO_2$, and has a thickness of 15 nm and a refractive index of 2.0. The light exit layer 414 is made of ZnO, and has a thickness of 35 nm and a refractive index of 2.0.

In the heterojunction layer group 20, the N-type Si wafer 201 has a thickness of 0.2 mm. The first intrinsic amorphous silicon layer 202 and the second intrinsic amorphous silicon layer 204 include 30 wt % of oxygen and have a thickness of 5 nm. The N-type amorphous silicon layer 203 has a thickness of 20 nm, and the P-type amorphous silicon layer 205 has a thickness of 20 nm.

The reflection layer 41 is made of Ag and has a thickness of 120 nm.

The metal electrode layer 50 is made of an Ag paste.

The efficiency of the tandem solar cell of Embodiment 3 is shown in Table 1.

Embodiment 4

In the light absorbing layer 10, the excitation layer 11 is made of photoactive perovskite $MAPbI_3$. The electron transport layer 120 is made of $TiO_2$ and has a thickness of 7 nm. The conductive layer 121 is made of AGZO, where ZnO is doped with $Al_2O_3$ and $Ga_2O_3$, and the conductive layer includes 98 wt % of ZnO, 1 wt % of $Al_2O_3$, and the balance being $Ga_2O_3$ and an inevitable impurity. The hole transport layer 40 is made of $Cu_2O$.

In the PN junction 42, the P-type nano-silicon layer 421 has a thickness of 20 nm, and the N-type nano-silicon layer 420 has a thickness of 16 nm.

In the light transmission layer 30, the first conductive layer 410 is made of $In_2O_3$, and has a thickness of 40 nm and a refractive index of 1.9. The first protective layer 411 is made of $SnO_2$, and has a thickness of 5 nm and a refractive index of 2.0. The second conductive layer 412 is made of a mixture of CuNi and CuNiNX, and has a thickness of 20 nm and a refractive index of 0.9. The second protective layer 413 is made of $Si_3N_4$, and has a thickness of 10 nm and a refractive index of 2.0. The light exit layer 414 is made of $Nb_2O_5$, and has a thickness of 30 nm and a refractive index of 2.0.

In the heterojunction layer group 20, the N-type Si wafer 201 has a thickness of 0.2 mm. The first intrinsic amorphous silicon layer 202 and the second intrinsic amorphous silicon layer 204 include 15 wt % of oxygen and have a thickness of 5 nm. The N-type amorphous silicon layer 203 has a thickness of 20 nm, and the P-type amorphous silicon layer 205 has a thickness of 20 nm.

The reflection layer 41 is made of Ag and has a thickness of 120 nm.

The metal electrode layer 50 is made of an Ag paste.

The efficiency of the tandem solar cell of Embodiment 4 is shown in Table 1.

Embodiment 5

In the light absorbing layer 10, the excitation layer 11 is made of photoactive perovskite $MAPbI_3$. The electron transport layer 120 is made of $Al_2O_3$ and has a thickness of 5 nm. The conductive layer 121 is made of BGZO, where ZnO is doped with $B_2O_3$ and $Ga_2O_3$, and the conductive layer includes 94 wt % of ZnO, 2.5 wt % of $B_2O_3$, and the balance being $Ga_2O_3$ and an inevitable impurity. The hole transport layer 40 is made of CuO.

In the PN junction 42, the P-type nano-silicon layer 421 has a thickness of 30 nm, and the N-type nano-silicon layer 420 has a thickness of 12 nm.

In the light transmission layer 30, the first conductive layer 410 is made of ITiO, and has a thickness of 38 nm and a refractive index of 2.0. The first protective layer 411 is made of Al, and has a thickness of 2 nm and a refractive index of 0.9. The second conductive layer 412 is made of a mixture of AgAl and $AgAlO_x$, and has a thickness of 7 nm and a refractive index of 0.3. The second protective layer 413 is made of TiN, and has a thickness of 7 nm and a refractive index of 2.0. The light exit layer 414 is made of $SnO_2$, and has a thickness of 40 nm and a refractive index of 2.0.

In the heterojunction layer group 20, the N-type Si wafer 201 has a thickness of 0.2 mm. The first intrinsic amorphous silicon layer 202 and the second intrinsic amorphous silicon layer 204 include 20 wt % of oxygen and have a thickness of 6 nm. The N-type amorphous silicon layer 203 has a thickness of 20 nm, and the P-type amorphous silicon layer 205 has a thickness of 20 nm.

The reflection layer 41 is made of AN AgMg alloy and has a thickness of 130 nm.

The metal electrode layer 50 is made of an Ag paste.

The efficiency of the tandem solar cell of Embodiment 5 is shown in Table 1.

Comparative Example

The comparative example is demonstrated by a conventional perovskite solar cell in the prior art.

The excitation layer is made of photoactive perovskite $MAPbI_3$. The electron transport layer is made of ZnO. The hole transport layer is made of NiO.

The efficiency of the tandem solar cell of Comparative Example is shown in Table 1.

TABLE 1

| SN | Refractive index of light transmission layer, thickness (nm) | Refractive index of second hole transport layer, thickness (nm) | Material of reflection layer | Efficiency |
|---|---|---|---|---|
| Embodiment 1 | 1.24/110.5 nm | 3.8/20 nm | Al | 30.6% |
| Embodiment 2 | 1.27/111 nm | 3.8/20 nm | Cu | 30.2% |
| Embodiment 3 | 1.23/120 nm | 3.8/20 nm | Ag | 30.8% |
| Embodiment 4 | 1.25/105 nm | 3.8/20 nm | Ag | 30.5% |
| Embodiment 5 | 1.28/94 nm | 3.8/20 nm | AgMg alloy | 30.0% |
| Comparative Example | — | — | — | 18.7% |

As shown in Table 1, the efficiency of the tandem solar cells according to Embodiments 1 to 5 of the present disclosure is higher, above 30%, while the efficiency of the solar cell in the prior art is about 20%.

The above described are merely preferred embodiments of the present disclosure, which are not intended to limit the present disclosure. Various changes and modifications can be made to the present disclosure by those skilled in the art. Any modifications, equivalent replacements, improvements, etc. made within the spirit and principle of the present disclosure should be included within the protection scope of the claims of the present disclosure.

The invention claimed is:

1. A tandem solar cell, comprising:
   a light absorbing layer group, comprising an excitation layer, a first electron transport layer group provided on a first side of the excitation layer and a first hole transport layer group provided on a second side of the excitation layer; and a heterojunction layer group, wherein the heterojunction layer group comprises a first side being a second electron transport layer in contact with the first hole transport layer group, and a second side being a second hole transport layer;

wherein, a reflection layer is provided on a side adjacent to the second hole transport layer of the heterojunction layer group; and the reflection layer reflects sunlight irradiated thereon through the light absorbing layer group and the heterojunction layer group into the tandem solar cell; a light transmission layer is provided between the second hole transport layer and the reflection layer; and the light transmission layer has a refractive index less than a refractive index of the second hole transport layer, wherein the reflection layer consists of one of Al, Cu, Mo, or an AgMg alloy; and wherein the light transmission layer comprises: a first conductive layer in contact with the second hole transport layer; a first protective layer in contact with the first conductive layer; a second conductive layer in contact with the first protective layer; a second protective layer in contact with the second conductive layer; and a light exit layer in contact with the second protective layer;

wherein the first conductive layer is made of one of $In_2O_3$, $SnO_2$, ZnO, ITO, AZO, IZO, ITIO, IZTO and FTO;

the first protective layer is made of one of Si, Ti, Al, Ni, Cr, NiCr, TiN, ZnO, $TiO_2$, $SnO_2$, SiO2, Nb2O5, Ta2O5 and Si3N4;

a conductive material of the second conductive layer is one of Ag, Cu, Al, Mo, an Ag alloy, a Cu alloy, an Al alloy and a Mo alloy, and the second conductive layer further comprises an inclusion formed from an oxide and/or a nitride of the conductive material of the second conductive layer;

the second protective layer is made of one of TiN, ZnO, $TiO_2$, $SnO_2$, $SiO_2$, $Si_3N_4$, AZO, IZO and YZO; and the light exit layer is made of one of $TiO_2$, $SnO_2$, ZnO, $Nb_2O_5$, $Ta_2O_5$, $Si_3N_4$, ZnS, $SiO_2$, $Al_2O_3$, MgF, MgS, SiC, AZO, GZO and YZO; and under the irradiation of the sunlight and reflected light, the excitation layer and the heterojunction layer group are excited; electrons generated by the excitation layer are transported out of the tandem solar cell through the first electron transport layer; holes generated by the excitation layer flow to the heterojunction layer group through the first hole transport layer group and combine with electrons generated by the heterojunction layer group; and holes generated by the heterojunction layer group are transported out of the tandem solar cell from the second hole transport layer.

2. The tandem solar cell according to claim 1, wherein the first hole transport layer group comprises a hole transport layer in contact with the excitation layer and a PN junction in contact with the hole transport layer; and the PN junction is in contact with the second electron transport layer.

3. The tandem solar cell according to claim 1, wherein the light transmission layer has a refractive index of 1.15-1.35 and a thickness of 50-200 nm; and the second hole transport layer has a refractive index of 3.5-4.2 and a thickness of 0-30 nm.

4. The tandem solar cell according to claim 3, wherein, the first conductive layer has a first refractive index n1 and a first thickness d1, the first protective layer has a second refractive index n2 and a second thickness d2, the second conductive layer has a third refractive index n3 and a third thickness d3, the second protective layer has a fourth refractive index n4 and a fourth thickness d4, and the light exit layer has a fifth refractive index n5 and a fifth thickness d5; and n1 is 1.8-2.1, and d1 is 20-80 nm; n2 is 0.1-5, and d2 is 0.5-10 nm; n3 is 0.1-1.5, and d3 is 5-50 nm; n4 is 1.3-2.1, and d4 is 0.5-25 nm; and n5 is 1.4-2.4, and d5 is 20-80 nm.

5. The tandem solar cell according to claim 2, wherein the heterojunction layer group comprises:

an N-type Si wafer;

a first intrinsic amorphous silicon layer on a first surface of the N-type Si wafer, wherein the first intrinsic amorphous silicon layer is doped with oxygen;

an N-type amorphous silicon layer on the first intrinsic amorphous silicon layer, wherein the N-type amorphous silicon layer forms the second electron transport layer;

a second intrinsic amorphous silicon layer on a second surface of the N-type Si wafer; and a P-type amorphous silicon layer on the second intrinsic amorphous silicon layer, wherein the P-type amorphous silicon layer forms the second hole transport layer.

6. The tandem solar cell according to claim 5, wherein the first intrinsic amorphous silicon layer comprises 0-30 wt % of oxygen.

7. The tandem solar cell according to claim 2, wherein the PN junction comprises an N-type nano-silicon layer in contact with the second electron transport layer and a P-type nano-silicon layer on the N-type nano-silicon layer; and the P-type nano-silicon layer is in contact with the hole transport layer.

8. The tandem solar cell according to claim 1, wherein the first electron transport layer group comprises an electron transport layer in contact with the excitation layer and a conductive layer in contact with the electron transport layer.

9. The tandem solar cell according to claim 8, wherein the conductive layer is made of $In_2O_3$ and a dopant, the dopant is one or more of $Ga_2O_3$, $ZnO_2$, $CeO_2$, $TiO_2$, $MO_2O_3$, $ZrO_2$ and $WO_2$, wherein the conductive layer comprises 80-100 wt % of $In_2O_3$, and the balance being the dopant and an inevitable impurity; or the conductive layer is made of ZnO and a dopant, the dopant is one or more of $SnO_2$, $Al_2O_3$, $Ga_2O_3$ and $B_2O_3$, wherein the conductive layer comprises 80-100 wt % of ZnO, and the balance being the dopant and an inevitable impurity.

10. The tandem solar cell according to claim 3, wherein the heterojunction layer group comprises:

an N-type Si wafer;

a first intrinsic amorphous silicon layer on a first surface of the N-type Si wafer, wherein the first intrinsic amorphous silicon layer is doped with oxygen;

an N-type amorphous silicon layer on the first intrinsic amorphous silicon layer, wherein the N-type amorphous silicon layer forms the second electron transport layer;

a second intrinsic amorphous silicon layer on a second surface of the N-type Si wafer; and a P-type amorphous silicon layer on the second intrinsic amorphous silicon layer, wherein the P-type amorphous silicon layer forms the second hole transport layer.

11. The tandem solar cell according to claim 4, wherein the heterojunction layer group comprises:
- an N-type Si wafer;
- a first intrinsic amorphous silicon layer on a first surface of the N-type Si wafer, wherein the first intrinsic amorphous silicon layer is doped with oxygen;
- an N-type amorphous silicon layer on the first intrinsic amorphous silicon layer, wherein the N-type amorphous silicon layer forms the second electron transport layer,
- a second intrinsic amorphous silicon layer on a second surface of the N-type Si wafer; and
- a P-type amorphous silicon layer on the second intrinsic amorphous silicon layer, wherein the P-type amorphous silicon layer forms the second hole transport layer.

* * * * *